United States Patent [19]

Fazlin

[11] Patent Number: 4,474,659

[45] Date of Patent: Oct. 2, 1984

[54] PLATED-THROUGH-HOLE METHOD

[76] Inventor: Fazal Fazlin, 11400 4th St. N., St. Petersburg, Fla. 33702

[21] Appl. No.: 383,311

[22] Filed: May 28, 1982

[51] Int. Cl.³ .......................................... C23C 15/00
[52] U.S. Cl. ................................ 204/192 R; 204/298
[58] Field of Search ............... 204/192 R, 298, 192 C, 204/192 SP; 427/39, 97, 40

[56] References Cited

U.S. PATENT DOCUMENTS 4,351,697  9/1982  Shanefield et al. ................ 427/97
4,425,210  1/1984  Fazlin ............................ 204/19 ZE

OTHER PUBLICATIONS

Cairns, M., *Sputtering: A Surface Treatment for Economy and Fine Finish*, Design Engineering, Nov. 1970, pp. 83-85.

*Primary Examiner*—Evan K. Lawrence
*Attorney, Agent, or Firm*—Stefan Stein

[57] ABSTRACT

An apparatus and method for depositing a thin layer of material such as metal within the hole of an object such as a printed circuit board. The apparatus includes a gas diffusion chamber having a plurality of power electrodes with apertures positioned transversely therein. The objects to be treated, such as printed circuit boards, are positioned in the areas between the power electrodes. A supply of electrical energy is connected to the power electrodes and to the conductive layers of the printed circuit boards. The method of the invention comprises introducing desired gases into the chamber to flow transversely through the apertures in the power electrodes and the holes in the printed circuit boards such that the gases are excited to a plasma state to sputter a portion of the material constituting the power electrodes into the holes of the printed circuit boards.

8 Claims, 17 Drawing Figures

Fig. 12
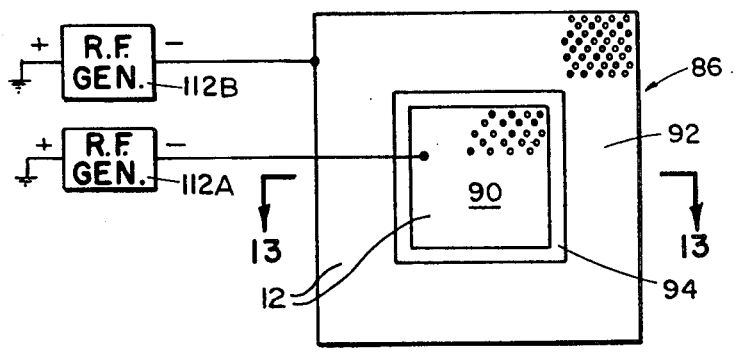
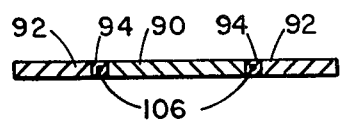
Fig. 13
Fig. 14
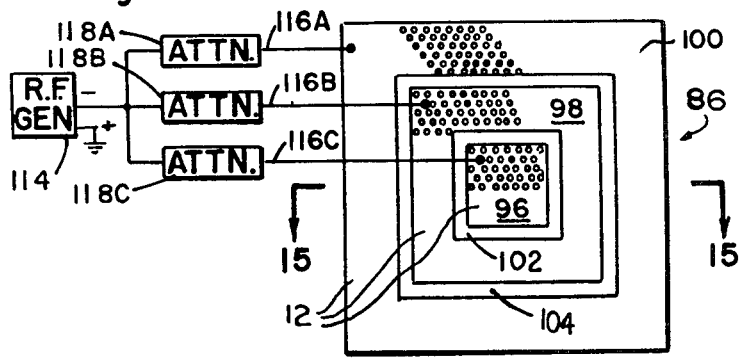
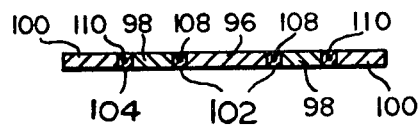
Fig. 15

PLATED-THROUGH-HOLE METHOD

BACKGROUND OF THE INVENTION

1. Field of the Invention

This invention relates to a plated-through-hole method. More particularly, this invention relates to a method for depositing a thin layer of material such as metal onto the entire inside surface of a hole in an object.

2. Description of the Prior Art

Presently there exist many techniques used in the manufacture of a printed circuit board. Basically, the four different types of printed circuit boards are single sided boards, double sided boards, multi-layered boards, and flexible boards. Except for single sided boards and single sided flexible boards, it is necessary to provide electrical continuity via the holes in the boards, between the conductive pattern on each side of the board. This is accomplished by plating a layer of conductive material onto the inside surface of the hole in the board, and is referred to as the plated-through-hole operation of the manufacturing process. The only presently available plated-through-hole methods consist of electrolytic plating, electroless plating, and immersion plating. Each of these methods have their own particular advantages and disadvantages which largely depend on the type of printed circuit board being treated.

By way of example, electroless plating, which is probably the most widely used commercial method, basically comprises subjecting the boards to a cleaning procedure, an activation procedure, and then a copper deposition procedure. More particularly, the cleaning procedure includes cleaning the boards with an alkaline cleaner to remove light oil and grease, fingerprints, etc. The holes in the boards are then "conditioned" to accept activation and subsequent electroless copper deposition. The conditioning of the holes involves removing epoxy smear caused by the drilling operation. Drill smear can be removed from within the holes by utilizing an etchback process, or by utilizing my novel plasma desmearing apparatus and method which is disclosed in my U.S. Pat. No. 4,425,210, the disclosure of which is hereby incorporated by reference. After drill smear is removed from within the holes, the holes are preetched by using ammonium persulfate, sodium persulfate, or hydrogen peroxide/sulfuric acid. This removes copper oxide and etches the copper to a uniform matte finish. Next, the boards are dipped into sulfuric acid to remove any persulfate residues which would interfere with adhesion. The boards are then thoroughly rinsed in water to remove any sulfuric acid residues. This completes the cleaning procedure of the plated-thru-hole operation.

The activation procedure comprises subjecting the boards to a preactivator (pre-dip) and then an activator (catalyst) which seeds particles of tin/palladium onto the nonconductive holes in order to provide a basis for subsequent electroless copper deposition. After one or more water rinses, the boards are immersed in an accelerator which dissolves the tin from the tin/palladium complex that was deposited in the holes by the activator. The activation procedure is completed by thoroughly rinsing the boards with tap water or deionized water.

The copper deposition procedure comprises immersing the boards into an electroless copper bath which contains copper sulfate or chloride, sodium hydroxide, a reducing agent such as formaldehyde, and a complexing agent which holds the copper in solution. The boards remain in the copper bath for an appropriate length of time (depending on the desired thickness of the deposited layer of copper), and are removed and rinsed in water. After scrubbing and drying the boards, the boards are ready for the image transfer operation.

From the foregoing, it should be appreciated that electroless copper deposition is an extremely lengthy process. Moreover, the multitude of variables involved in the process makes the process more an art than a science, and results in nonuniform deposition of the copper within the holes of the printed circuit boards.

Therefore, it is an object of this invention to provide an apparatus and method which overcomes the aforementioned inadequacies of the prior art devices and provides an improvement which is a significant contribution to the art of depositing metal on the inside surface of the holes in a printed circuit board.

Another object of this invention is to provide an apparatus and method for depositing a material onto an object by using plasma gas techniques.

Another object of this invention is to provide an apparatus and method for depositing a material on the surface of an object in a controlled process with a high level of precise repeatability and at cyclic rates substantially reducing the overall cost of the process.

Another object of this invention is to provide an apparatus and method for depositing the material uniformly on the surface of the object.

The foregoing has outlined some of the more pertinent objects of the invention. These objects should be construed to be merely illustrative of some of the more prominent features and applications of the intended invention. Many other beneficial results can be attained by applying the disclosed invention in a different manner by modifying the invention within the scope of the disclosure. Accordingly, other objects and a fuller understanding of the invention may be had by referring to the summary of the invention and the detailed description of the preferred embodiment in addition to the scope of the invention defined by the claims taken in conjunction with the accompanying drawings.

SUMMARY OF THE INVENTION

The invention is defined by the appended claims with a specific embodiment shown in the attached drawings. For the purpose of summarizing the invention, the invention comprises a plated-through-hole method which deposits a thin layer of material such as metal within the hole of an object such as a printed circuit board. The apparatus used to carry out the invention includes a chamber having a gas diffusion chamber connected to each end thereof. Means are provided for introducing a gas or a mixture of gases into one or both of the gas diffusion chambers and into the central area of the chamber itself. A vacuum pump is connected in fluid communication with the gas diffusion chambers for evacuating the chamber and for producing the desired flow of the gas in one direction and then in the other direction within the chamber. A plurality of power electrodes with apertures are positioned within the chamber transverse to the direction of the flow of the gases. The objects to be treated such as the printed circuit boards are then inserted into the areas between the power electrodes. The output of a generator means is connected to the power electrodes for supplying electrical energy thereto. The outer conductive layers of the printed circuit boards being treated are then connected to the ground of the generator means to complete the path of the electrical energy.

The method of the invention basically comprises introducing the desired gases into one of the diffusion chambers while creating a reduced pressure in the other gas diffusion chamber such that the gas is drawn through the apertures in the power electrodes and the printed circuit boards. The direction of the flow of the gas is then reversed by introducing the gas into the other gas diffusion chamber and creating a reduced pressure in the opposite gas diffusion chamber. Simultaneous with the flow of the gas in the chamber, the generator means supplies an amount of electrical energy to the power electrodes. The electrical energy excites the gas to a plasma state as the gas flows through apertures in the power electrodes. As the plasma gas flows through the chamber, a portion of the material constituting the power electrode is sputtered into the holes of the printed circuit boards. The process is continued until the entire inside surface of the holes is uniformly coated with the material constituting the power electrode.

The foregoing has outlined rather broadly the more pertinent and important features of the present invention in order that the detailed description of the invention that follows may be better understood so that the present contribution to the art can be more fully appreciated. Additional features of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a fuller understanding of the nature and objects of the invention, reference should be had to the following detailed description taken in connection with the accompanying drawings in which:

FIG. 12 is a side view of the third embodiment of the improved power electrode;

FIG. 13 is a cross-sectional view of FIG. 12 along lines 13—13;

FIG. 14 is a side view of the fourth embodiment of the improved power electrode;

FIG. 15 is a cross-sectional view of FIG. 14 along lines 15—15; and

Similar reference characters refer to similar parts throughout the several views of the drawings.

DETAILED DESCRIPTION OF THE PREFERRED EMBODIMENT

Figure 1:
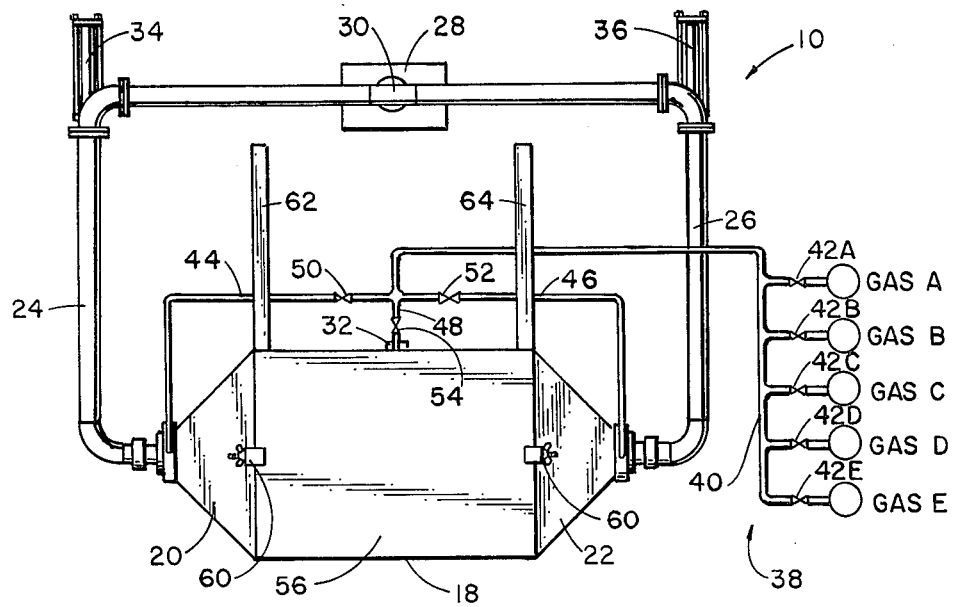
FIG. 1 is a plan view of the plated-thru-hole apparatus of the invention showing the chamber thereof and diagrammatically showing the manner in which a plurality of gases are supplied to the chamber.
Figure 2:
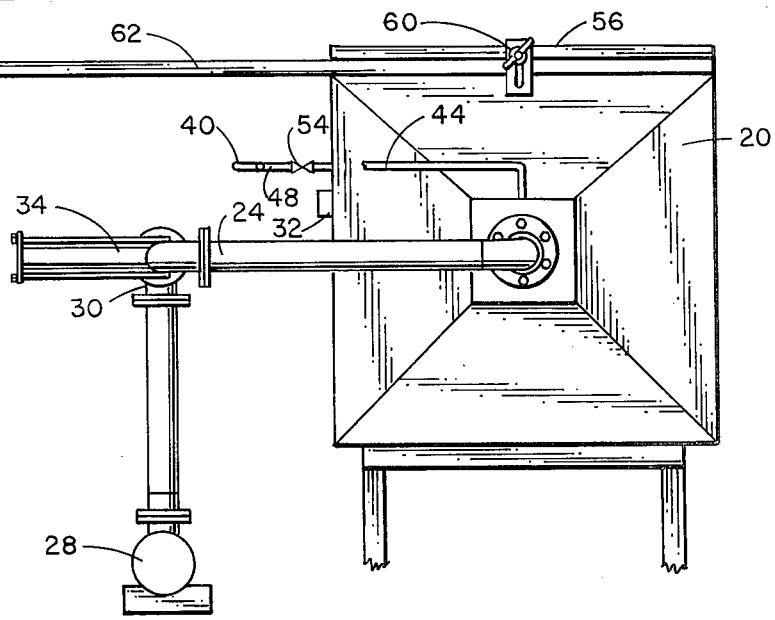
FIG. 2 is a left end view of FIG. 1.

FIG. 1 is a plan view of the plated-through-hole apparatus 10 of the invention designed to deposit a thin layer of material such as a metal 12 on the inside surface of a hole 14 in an object such as a double-sided, multi-layered, or flexible printed circuit board 16. More particularly, the apparatus 10 comprises a substantially rectangular chamber 18. A frustopyramidal diffusion chamber 20 is connected to the left side of the chamber 18 (see FIG. 2). Similarly, another frustopyramidal diffusion chamber 22 is connected to the right side of the chamber 18. A left and a right exhaust conduit 24 and 26 are respectively connected in fluid communication with the diffusion chambers 20 and 22 and are oriented to extend rearwardly of the chamber 18. The two exhaust conduits 24 and 26 then extend laterally of the chamber 18 and are each connected to a vacuum pump 28 by a tee conduit 30. Preferably, vacuum pump 28 comprises a Stokes Pennwalt vacuum pump, Model 1736, with halocarbon oil for oxygen service which is capable of exhausting the chamber 18 to approximately 11 microns at a rate of 650 cubic feet per minute. A solenoid operated air valve 32 is connected to the rear of the chamber 18 for venting atmospheric air into the chamber 18 to normalize the pressure in the chamber 18. A left and a right exhaust valve 34 and 36 are connected in fluid communication with the left and right exhaust conduits 24 and 26, respectively. Preferably, each of the exhaust valves 34 and 36 comprises a Vacuum Research Corporation exhaust valve, Model 6AV, which is air activated at 60 p.s.i. and which is solenoid controlled.

The plated-through-hole apparatus 10 of the invention further includes means for supplying a mixture of gases to the chamber 18. More particularly, a plurality of gas bottles 38 are provided for storing a particular gas identified as gases A through E inclusive. The output of each of the gas bottles 38 is connected to a gas manifold 40. The amount of gas supplied from the bottles 38 to the gas manifold 40 is controlled by means of electrically operated valves 42A–E, or the like. The output of the gas manifold 40 is then connected to a left and a right supply conduit 44 and 46 which are in turn connected in fluid communication with the diffusion chambers 20 and 22, respectively. A middle supply conduit 48 similarly extends from the gas manifold 40 to the central area of the chamber 18. Suitable control valves 50, 52, and 54 are connected within the conduits 44, 46, 48, respectively, to control the flow of gas into the chamber 18.

A lid 56 is secured about the opened end of the chamber 18. The lid 56 comprises a substantially rectangular configuration which is dimensioned to fit over the opened end of the chamber 18. A gasket 58 is positioned about the periphery of the opened end of the chamber 18 enabling the lid 56 to seal about the opened end of the chamber 18 (see FIG. 3). Suitable latches 60 are positioned at opposing ends of the chamber 18 to rigidly secure the lid 56 in the closed position. The lid 56 is operatively connected to a pair of rails 62 and 64 which extend rearwardly of the chamber 18 such that the lid 56 may be slid rearwardly away from the opened end of the chamber 18 to an open position.

Figure 3:
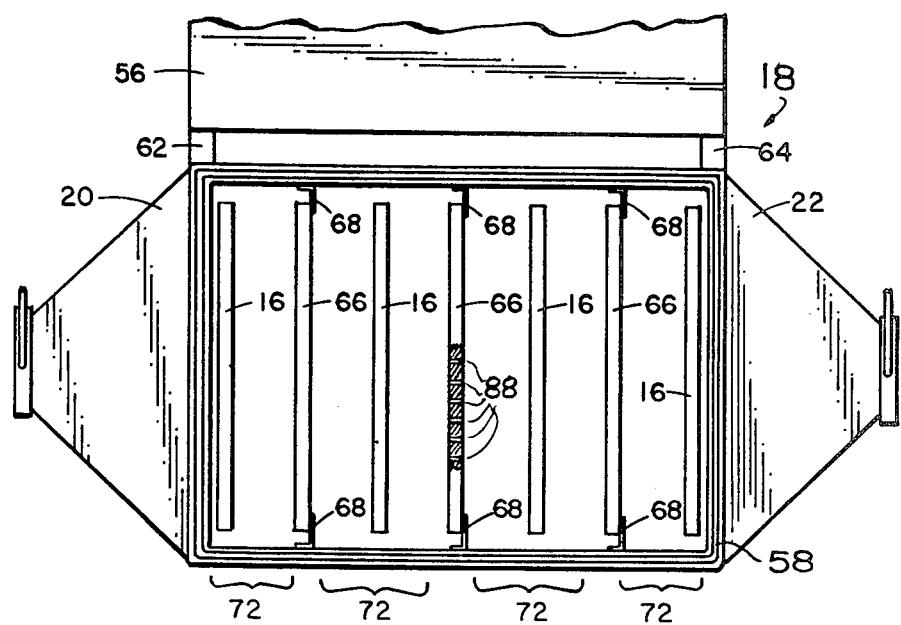
FIG. 3 is a plan view, partially in section, of the chamber with the lid in an open position showing the placement of the power electrodes and the printed circuit boards in the chamber and including a partial cross-sectional view of one of the power electrodes showing the apertures in the power electrode.

FIG. 3 is a plan view, partially in section, of the chamber 18 showing the interior thereof. More particularly, a plurality of power electrodes 66 with apertures 88 are uniformly suspended within the chamber 18 by means of a plurality of electrically insulative standoffs 68 which are rigidly secured to each of the power electrodes 66 about the sides and bottom thereof. The standoffs 68 are then rigidly secured to the inside surface of the chamber 18 such that the power electrodes 66 extend traversely across the longitudinal length of the chamber 18.

Figure 4:
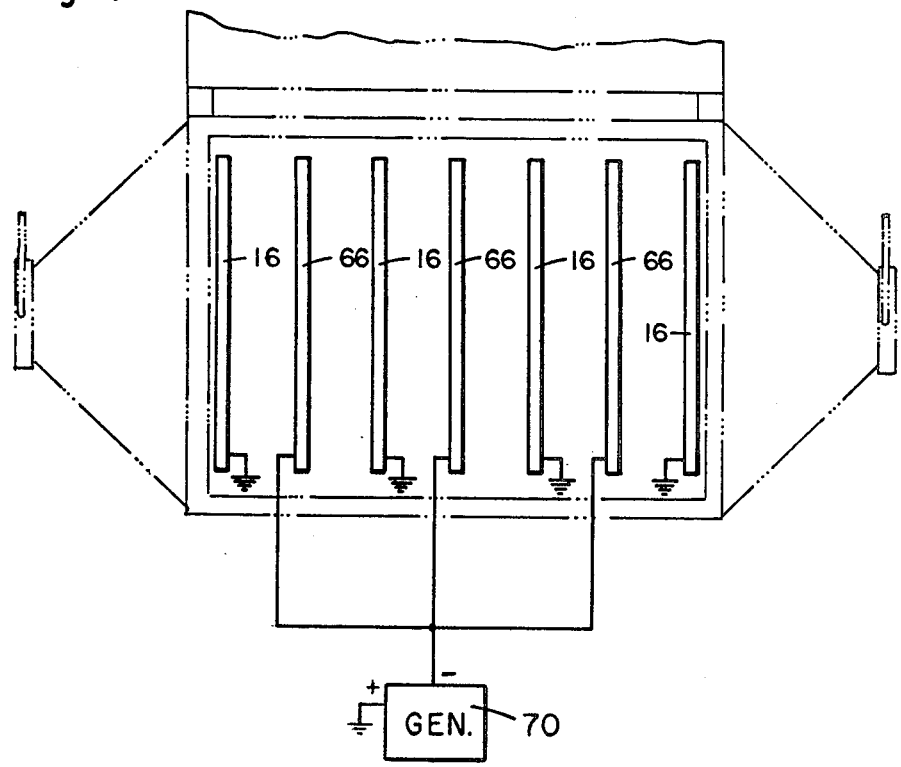
FIG. 4 is a diagrammatical view showing the manner in which the power electrodes and the printed circuit boards are connected to a source of electrical energy.

As shown in FIG. 4, a source of electrical energy, hereinafter referred to as a generator 70, is provided for supplying electrical energy to the power electrodes 66 to create a plasma gas in the chamber 18. Specifically, the output of the generator 70 is connected to the power electrodes 66 by a coaxial cable or the like. The ground of the generator 70 is then connected (not shown) to the chamber 18 and to the printed circuit board 16. The generator 70 may comprise a direct current generator for supplying electrical energy at a constant rate and power level to the power electrodes 66. Alternatively, the generator 70 may comprise a frequency generator for supplying electrical energy at a predetermined frequency and power level to the power electrodes 66.

It is noted that the cross-sectional area of the chamber 18 preferably comprises a configuration substantially identical to the configuration of the object 16 to be treated. For example, when treating printed circuit boards 16 which typically include square configurations, it is desirable to configure and dimension the chamber 18 such that the printed circuit boards 16 may be inserted transversely in the chamber 18 without a significant amount of space existing between the peripheral edges of the board 16 and the walls of the chamber 18. Further, it is noted that the power electrodes 66 are preferably uniformly spaced apart from one another and possibly from the sides of the chamber 18 to define receiving areas 72 for receiving one or more printed circuit boards 16.

Referring to FIGS. 1–5, the method of the invention for depositing a material such as a metal 12 on the inside surface of the holes 14 contained within the printed circuit boards 16 comprises the following steps. First, the lid 56 is slid rearwardly along the rails 62 and 64 to expose the opened end of the chamber 18. The printed circuit boards 16 are then inserted into the chamber 18 between adjoining power electrodes 66. In the specific embodiment of the chamber 18 which contains three power electrodes 66, shown diagrammatically in FIG. 4, four printed circuit boards 16 are inserted within the chamber 18 such that only one printed circuit board 16 is positioned within each receiving area 72. It should be understood, however, that a plurality of printed circuit boards 16 may be inserted within each receiving area 72 without departing from the spirit and scope of this invention. The next step of the method includes grounding the outermost of the conductive layers 16A of the printed circuit board 16 (see FIG. 5) to the ground of the generator 70. Next, the lid 56 is slid forwardly along rails 62 and 64 to a closed position over the opened end of the chamber 18. Latches 60 are then tightened to sealingly secure the lid 56 in the closed position. The printed circuit boards 16 are now ready to receive the treatment of deposition of the metal 12 in the holes 14 contained in the printed circuit boards 16.

The plated-through-hole portion of the method of the invention comprises, first, activating the vacuum pump 28 to evacuate the interior of the chamber 18. A desired blend of gases is then selected by controlling valves 42A–E which regulate the selection and the flow rate of the gases contained within the gas bottles 38A–E into the gas manifold 40. The method proceeds by closing the right exhaust valve 36 and opening the right control valve 52 of the right supply conduit 46 while opening the left exhaust valve 34 and closing the left control valve 50 and the middle control valve 54. This causes the selected blend of gases to flow into the right diffusion chamber 22 wherein the gases are uniformly diffused over the cross-sectional area of the chamber 18. The reduced pressure created by the vacuum pump 28 which is supplied to the left exhaust valve 34 draws the gases from the right supply conduit 46 to the left exhaust valve 34 such that the gases flow serially through apertures in the power electrodes 66 and the holes 14 in the printed circuit boards 16 from right to left. After a preselected length of time, the flow of the gases is reversed by closing the left exhaust valve 34 and opening the right exhaust valve 36, and opening the left control valve 50 and closing the right and middle control valves 52 and 54. The vacuum present at the right exhaust valve 36 draws the gases, which are injected into and diffused in the left diffusion chamber 20, serially through the power electrodes 66 and the printed circuit boards 16 in the reverse direction.

During the flow of the gases from one end of the chamber 18 to the other, the generator 70 is activated to supply electrical energy to the power electrodes 66. The gases flowing through the apertures 88 in the power electrodes 66 are therefore excited to a plasma state. Additionally, with the power electrodes 66 being at least partially composed of the type of material such as the metal 12 to be deposited on the inside of the holes 14 of the printed circuit boards 16, a portion of such metal 12 will be "sputtered" from the power electrodes 66 into the holes 14 (and onto all exposed surfaces) of the printed circuit board 16 adjacent to the power electrode 66. The thickness of the layer of metal 12 deposited in the holes 14 of the printed circuit boards 16 will be progressively increased each time the above procedure is repeated. More uniform plating can be achieved by alternating the direction of the flow of the gas through the power electrodes 66 and the printed circuit boards 16. The plated-through-hole portion of the method of the invention is completed when the desired thickness of the layer of metal in the hole has been achieved. A thickness of 25 to 100 microns is usually adequate.

The next portion of the method of the invention comprises the steps of opening both of the exhaust valves 34 and 36 and injecting nitrogen gas into the chamber 18 via control valves 50, 52, and 54. When all of the unwanted gases have been purged from the chamber 18 by the nitrogen gas, air valve 32 is opened to vent atmospheric air into the chamber 18. The lid 56 is then slid rearwardly along rails 62 and 64 to an open position. The treated printed circuit boards 16 are then removed from the chamber 18 thereby completing the method of the invention. The printed circuit boards 16 are now ready for further treatment of the manufacturing process.

Several variations may exist in the plated-through-hole portion of the method of the invention. For example, the control valves 50 and 52 may be controlled to pulsate on and off to create a pulsating flow of gas in one direction through the electrodes 66 and the printed circuit boards 16, and then create another pulsating flow of gas in the other direction through the power electrodes 66 and the printed circuit boards 16. The method of the invention further contemplates the introduction of gas from the middle supply conduit 48 into the chamber 18 via control valve 54. It is noted, however, that inasmuch as the gas being introduced via control valve 54 will not be subjected to the diffusing characteristics of the diffusing chambers 20 and 22, the use of the middle control valve 54 should be limited to introducing a small amount of gas into the chamber 18 to compensate for any depletion of the plasma gas therein.

Figure 5:
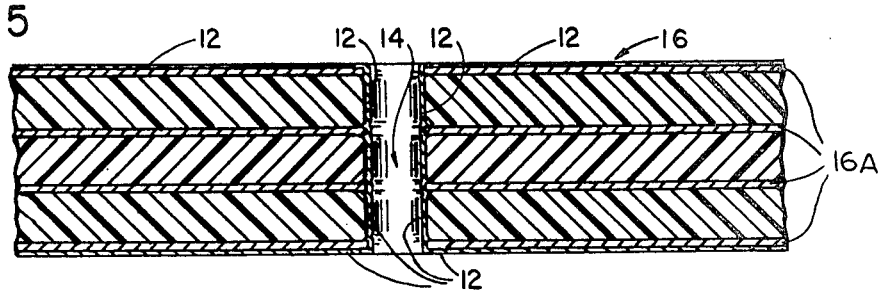
FIG. 5 is a cross-sectional view of a multi-layered printed circuit board which has been treated by the plated-through-hole method of the invention.

From the above description of the invention, it should be appreciated that an entirely novel concept has been disclosed for depositing a material within the inside of a hole in an object. In the specific illustration shown in the drawings, the method has been discussed in relation to depositing a layer of metal 12 within the entire inside surface of the hole 14 in a printed circuit board 16. This achieves many results. First, in a double-sided or a flexible printed circuit board 16, electrical continuity from one side of the board to the other is achieved. Secondly, in a multilayer printed circuit board 16, as shown in FIG. 5, electrical continuity among each layer 16A of the conductive patterns of the boards is achieved.

Figure 6:
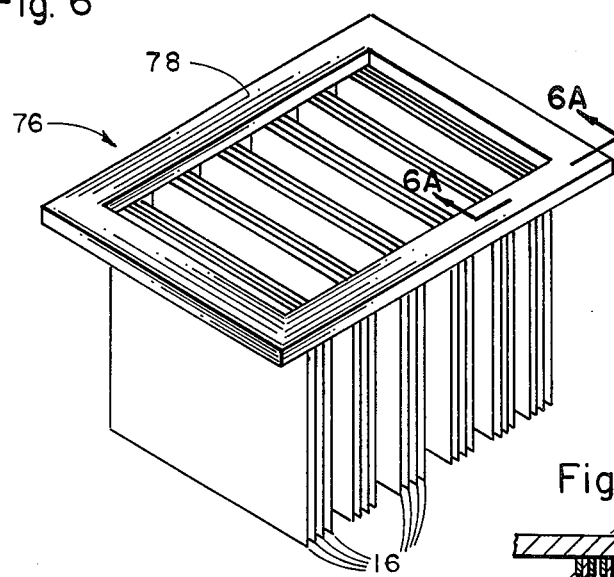
FIG. 6 is an isometric view of a printed circuit board rack having a plurality of printed circuit boards installed therein for insertion within the chamber of the plated-through-hole apparatus.
Figure 6A:
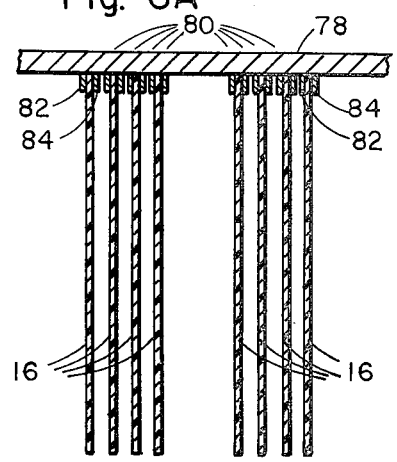
FIG. 6A is a cross-sectional view of FIG. 6 along lines 6A—6A illustrating the manner in which the printed circuit boards are secured to the rack.

Several improvements have been provided to the apparatus and method previously discussed to increase the throughput of the system during production and to achieve more uniform deposition of the metal 12 within the holes 14 of the printed circuit boards 16. More particularly, FIG. 6 illustrates a unique printed circuit board rack 76 which enables a plurality of printed circuit boards 16 to be quickly and easily loaded within the chamber 18 and then subsequently unloaded after treatment. The rack 76 comprises a substantially rectangular frame member 78 having a number of groups of retainer clips 80 secured to the underside thereof. Each of the retainer clips 80 comprises a left and right member 82 and 84 which are resiliently biased toward one another.

During use, the individual printed circuit boards 16 are secured to the underside of the frame member 78 by pushing the edges of the printed circuit boards 16 between the members 82 and 84 of the respective retainer clip 80. After each of the retainer clips 80 are filled with a respective printed circuit board 16, the rack 76 is lifted by hand or by a hoist, positioned over the opened end of the chamber 18, and then lowered into the chamber 18 such that the groups of the retainer clips 80 and, correspondingly, the group of installed printed circuit boards 16, are positioned between the power electrodes 66. A flange member (not shown) is connected to each of the sides of the chamber 18 to enable the frame member 78 of the rack 76 to seat thereon, rather than on top of the power electrodes 66. It is noted that the groups of retainer clips 80 must be spaced sufficiently apart such that the corresponding groups of printed circuit boards 16 will straddle, and not touch the power electrodes 66 as the groups of installed printed circuit boards 16 are loaded into their respective receiving areas 72. It is also noted that the members 82 and 84 of the retainer clips 80, the frame 78 of the rack 76, and the flange secured within the chamber 18 are each composed of an electrically conductive material such that the outer conductive layers of the printed circuit boards 16 will be electrically connected to the chamber 18 which is, in turn, connected to the ground of the generator 70. Thus, it should be appreciated that the rack 76, in addition to facilitating the loading of the printed circuit board 16 in the chamber 18, provides a convenient means for grounding the printed circuit boards 16 to the ground of the generator 70.

Figure 7:
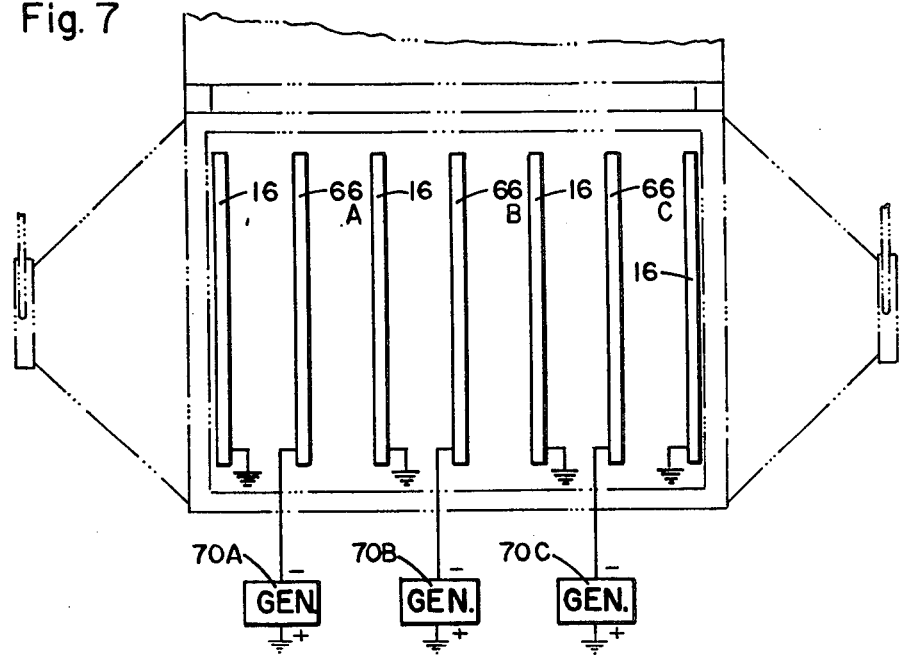
FIG. 7 is a diagrammatical view of the apparatus showing the manner in which the power electrodes may be connected to a plurality of sources of electrical energy.

Experiments have indicated that the plasma gas created within the chamber 18 will at least partially become depleted or saturated as the plasma gas flows from one end of the chamber 18 to the other. FIG. 7 is a diametric view of an improvement which compensates for any saturation of the plasma gas which may occur as the plasma gas flows from one end of the chamber 18 to the other. Specifically, this improvement includes providing three generators 70A, 70B, and 70C, the output of which are respectively connected to the power electrodes 66A, 66B, and 66C. Each of the generators 70A-C may individually comprise a direct current generator, or a frequency generator, and may be individually regulated to supply the same or differing amounts of electrical energy to their respective power electrodes 66A-C. This enables an increased amount of electrical energy to be progressively supplied to the power electrodes 66A-C with respect to the direction of the flow of the plasma gas such that the plasma gas will be increasingly excited to a higher plasma state as the plasma gas flows from one end of the chamber to the other. This compensates for any saturation of the plasma gas and, therefore, assures uniform deposition of the metal 12 in the holes 14 of the printed circuit boards 16. Of course, when the direction of the flow of the plasma gas is reversed, the increased supply of electrical energy must also be reversed such that the plasma gas will always be flowing through power electrodes 66 to which a progressively increased amount of electrical energy is supplied.

It should be appreciated that the amount of sputtering of the metal 12 from the power electrodes 66 to the respective printed circuit boards 16 installed within the chamber 18 is a function of the exposed surface area of the power electrodes 66 and the amount of electrical energy supplied to the power electrodes 66 per unit area (for example, watts per square inch). As noted earlier, the saturation of the plasma gas as the plasma gas flows from one end of the chamber to the other is easily compensated for by increasing the amount of electrical energy supplied to succeeding power electrodes 66. Experiments have indicated, however, that the sputtering of the metal 12 from the power electrodes 66 tends to concentrate more in the holes 14 located in the outer periphery of the printed circuit boards 16 than in those holes 14 located near the center portion of the printed circuit boards 16. It is unclear why this occurs. Nevertheless, an improved power electrode, identified in the drawings by the numeral 86, compensates for this nonuniform sputtering of the metal therefrom by increasing the amount of exposed surface area or the power density from the center portion to the outer peripheral edges of the power electrode 86.

Figure 8:
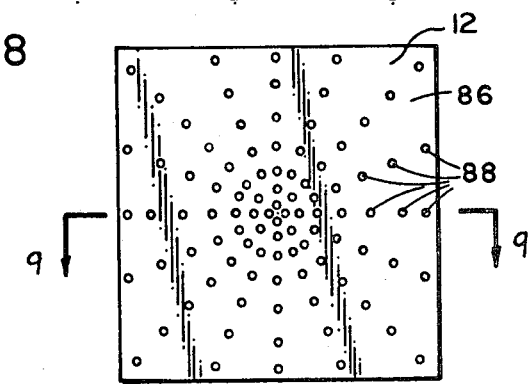
FIG. 8 is a side view of the first embodiment of an improved power electrode.
Figure 9:
FIG. 9 is a cross-sectional view of FIG. 8 along lines 9—9.

The first embodiment of the improved electrode 86 as shown in FIGS. 8 and 9 comprises incorporating a nonuniform distribution of the apertures 88 in the improved power electrode 86 such that the porosity of the improved power electrode 86 decreases from the central to the outer peripheral edges thereof. This results in a decreasing rate of exposed surface area from the central to the outer peripheral edges of the improved electrode 86. Thus, as the plasma gas flows through the apertures 88 in the improved power electrode 86, that portion of the plasma gas which flows through the apertures 88 in the center portion of the improved electrode 86 will be exposed to a greater surface area than the other portion of the plasma gas which flows through apertures 88 located in the outer portions of the improved power electrode 86. Although not shown, it is proposed that the same result may be accomplished by progressively decreasing or increasing the diameter of the apertures 88 from the center to the outer portions of the improved power electrode 86. It can be shown mathematically that the greatest exposed surface area occurs when the diameter of the apertures 88 decreases or increases from being equal to the thickness of the electrode 86. Thus, the diameter-equal-to-thickness apertures 88 in the center portion of the improved power electrode 86 will provide an increased surface area over the other smaller (or larger) diameter apertures 88 located in the outer peripheral edges of the improved power electrode 86.

Figure 10:
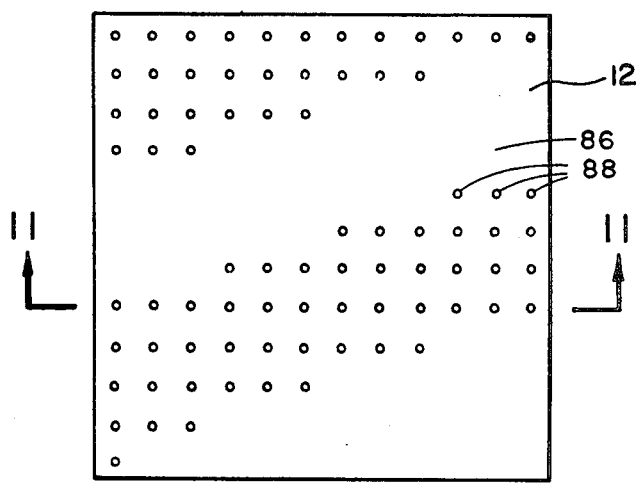
FIG. 10 is a side view of the second embodiment of the improved power electrode.
Figure 11:
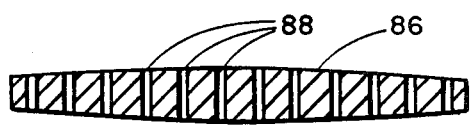
FIG. 11 is a cross-sectional view of FIG. 10 along lines 11—11.

FIGS. 10 and 11 illustrate another embodiment of the improved power electrode 86 which compensates for the nonuniform sputtering of the metal 12 from the improved power electrode 86 into the holes 14 in the printed circuit boards 16. This second embodiment of the improved power electrode 86 is manufactured from a sheet of the metal 12, the opposing sides of which are convexed outwardly such that the cross-sectional configuration of the improved power electrode 86 progressively decreases from the center to the outer portion thereof. Thus, the length of the apertures 88 in the improved power electrode 86 and the exposed surface area thereof, will progressively decrease from the center to the outer portions of the power electrode 86. It is proposed that this will achieve the same results as the first embodiment of the improved power electrode 86 such that that portion of the plasma gas flowing through the center portion of the improved power electrode 86 will be exposed to a greater surface area than the other portion of the plasma gas which flows through the outer portions of the improved power electrode 86. Uniform sputtering of the metal 12 from the improved power electrode 86 into the holes 14 of the printed circuit board 16 will therefore be achieved.

FIGS. 12 and 13 are a side view and a cross-sectional view, respectively, of the third embodiment of the improved power electrode 86. Specifically, the third embodiment of the improved power electrode 86 comprises a central electrode 90 which is positioned within a drilled out center portion of an outer electrode 92. A suitable dielectric 94 such as a ceramic insulator is positioned within the air space between the central and the outer electrodes 90 and 92 to prevent arcing thereacross. FIGS. 14 and 15 are a side view and a cross-sectional view of the fourth embodiment of the improved power electrode 86 which is a modification of the third embodiment shown in FIGS. 12 and 13. More particularly, the fourth embodiment of the improved power electrode 86 comprises a central electrode 96 positioned within the center of a middle electrode 98, which is in turn positioned within the center of an outer electrode 100. Two dielectrics 102 and 104 such as ceramic insulators are respectively positioned between the central electrode 96 and the middle electrode 98, and the middle electrode 98 and the outer electrode 100 to prevent arcing therebetween. A grounding wire represented by numerals 106, 108, and 110 may be molded within each of the respective dielectrics 94, 102, and 104 and connected to the ground of the system to ground any arcing which may occur between the respective electrodes 90 and 92, and 96, 98, and 100.

As shown in FIG. 12, electrical energy is supplied individually to the central and the outer electrodes 90 and 92 by means of two corresponding generators 112A and 112B. The power level of each of the generators 112A and 112B are individually controlled such that a greater amount of electrical energy is supplied to the central electrode 90 than to the outer electrode 92. This assures that the plasma gas flowing through the apertures in the central electrode 90 will be excited to a higher plasma state than the other portion of the gas flowing through the apertures in the outer electrode 92. Uniform sputtering of the metal 12 from the electrodes 90 and 92 into the holes 14 of the printed circuit boards 16 will therefore be achieved. The use of the two generators 112A and 112B also provides for supplying electrical energy at separate or the same frequency to the central and outer electrodes 90 and 92.

In a similar manner, differing power levels of electrical energy are supplied to the electrodes 98, 100, and 102 of the fourth embodiment of the improved power electrode 86. Specifically, FIG. 14 illustrates the output of a single generator 114 being connected to each of the electrodes 98, 100, and 102 of the improved power electrode 86 by conductors 116A, 116B, and 116C. Attenuators 118A, 118B, and 118C are respectively interconnected within the conductors 116A, 116B, and 116C to individually attenuate the power level of the electrical energy being supplied from the generator 114 to the electrodes 96, 98, and 100. Thus, a greater power density of the electrical energy may be achieved on the central electrode 96 than on the middle electrode 98, and on the middle electrode 98 than the outer electrode 100. It is noted that unlike the generators 112A and 112B described in conjunction with the third embodiment of the improved power electrode 86, the use of a single generator 114 together with the attenuators 118A–C in the fourth embodiment of the improved power electrode 86 precludes the supply of electrical energy at different frequencies to the individual electrodes 96, 98, and 100. It shall be understood, however, that individual generators may be electrically connected to the electrodes 96, 98, and 100 such that not only different power levels may be supplied to the individual electrodes 96, 98, and 100, but also electrical energy at different frequencies may be supplied to the individual electrodes 96, 98, and 100.

Figure 16:
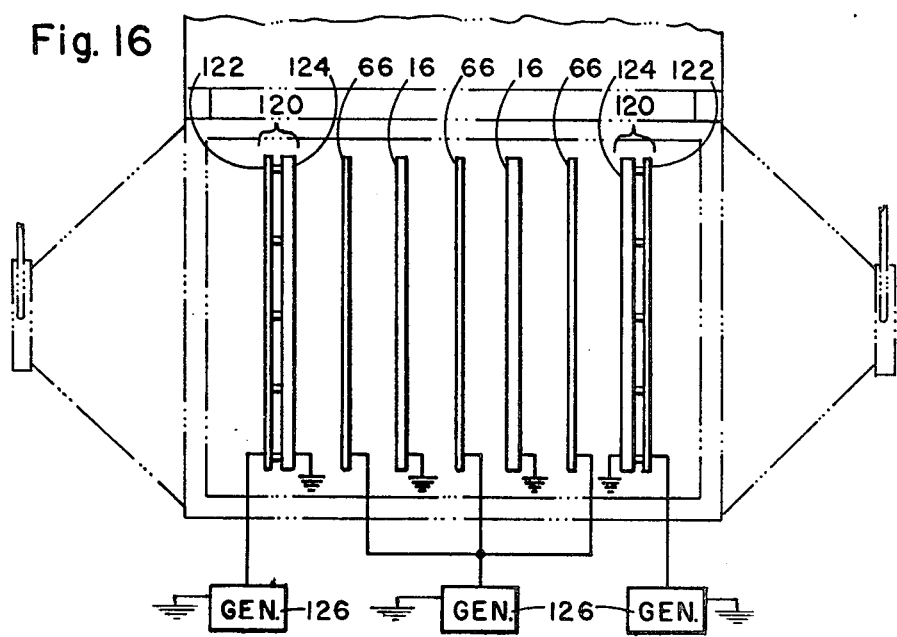
FIG. 16 is a diagrammatical view of the apparatus of the present invention incorporated within the plasma desmearing apparatus of my prior invention.

FIG. 16 is a diagrammatic view of the apparatus 10 of the inventions incorporated within my desmearing apparatus which is more particularly disclosed in my U.S. Pat. Nos. 4,328,081 and 4,425,210, entitled "Plasma Desmearing Apparatus and Method" which are hereby incorporated by reference into this application. Briefly summarizing, my prior inventions comprised a plurality of electrode pairs 120 which were uniformly spaced within a chamber or the like. Each electrode pair comprised a power electrode 122 spaced an appreciable distance apart from a ground electrode 124. The output of a generator 126 was then connected to the power electrode 122, with the ground electrode 124 being connected to the ground of the generator 126. In FIG. 16, it is shown that two such electrode pairs 120 are positioned within the chamber 18 of my present invention. Then, three of the power electrodes 66 of the present invention are equally spaced within the distance between the electrode pairs 120. Two printed circuit boards 16 are then inserted between the power electrodes 66 in the respective receiving areas 72. The first step of the treatment of the printed circuit boards 16 involves desmearing the holes 14 contained therein according to my prior inventions. Then, the holes 14 in the printed circuit boards 16 are plated-through by using the method of my present invention. It is noted that means must be provided for only grounding the printed circuit boards 16 during the plated-through-hole method and not during the desmearing process. The combination of the present invention and my prior inventions enables a single chamber to accomplish the desmearing method and the plated-through-hole method discussed above.

The present disclosure includes that contained in the appended claims as well as that of the foregoing description. Although this invention has been described in its preferred form with a certain degree of particularity, it is understood that the present disclosure of the preferred form has been made only by way of example and that numerous changes in the details of construction and the combination and arrangement of parts may be resorted to without departing from the spirit and scope of the invention.

Now that the invention has been described, I claim:

1. A method for depositing material on the inside surface of a hole in an object, comprising the steps of:
    providing a chamber for the confinement of a gas;
    positioning a power electrode with apertures in the chamber, the power electrode being at least partially composed of the material to be deposited on the inside surface of the hole in the object;
    positioning the object to one side of the power electrode;
    supplying a gas to the chamber;
    supplying an amount of electrical energy to the power electrode, said electrical energy being sufficient to excite the gas to a plasma state;
    grounding the object to the ground of the source supplying the electrical energy to the power electrode; and
    directing the flow of the gaseous plasma in the chamber to flow through the apertures in the material of the power electrode and to then flow through the hole in the object, whereby a portion of the material is sputtered from the power electrode and deposited on the inside surface of the hole in the object.

2. The method as set forth in claim 1, wherein the step of providing a chamber for the confinement of a gas includes the step of providing a diffusion chamber at the input and at the output of the chamber for assisting the uniform diffusion of the gas through the chamber.

3. The method as set forth in claim 1, further including the steps of:
    positioning a second object to the other side of the power electrode;
    grounding the second object to the ground of the source supplying the electrical energy to the power electrode; and
    reversing the direction of the flow of the gas in the chamber to again impact the power electrode and to then flow through the hole in the second object, whereby another portion of the material is sputtered from the power electrode and deposited on the inside surface of the holes in the first and second objects.

4. The method as set forth in claim 1, wherein the step of supplying an amount of electrical energy to the power electrode comprises the step of supplying an amount of electrical energy at a predetermined frequency to the power electrode.

5. The method as set forth in claim 1, wherein the step of supplying an amount of electrical energy to the power electrode comprises the step of supplying an amount of electrical energy at a constant rate to the power electrode.

6. The method as set forth in claim 1, wherein the step of supplying an amount of electrical energy to the power electrode includes the step of supplying a greater amount of electrical energy to the central area of the power electrode than to the outer portions of the power electrode.

7. The method as set forth in claim 1, wherein the step of supplying an amount of electrical energy to the power electrode includes the step of creating a power density on the surfaces of the power electrode which progressively decreases from the central area of the power electrode to the outer edges of the power electrode.

8. The method as set forth in claim 1, wherein the step of positioning a power electrode in the chamber includes incorporating a plurality of said apertures in the power electrode to produce a decreasing amount of exposed surface area of the power electrode from the central to the outer portions of the power electrode.

* * * * *